United States Patent
Gearhardt et al.

(10) Patent No.: US 7,216,279 B2
(45) Date of Patent: May 8, 2007

(54) TESTING WITH HIGH SPEED PULSE GENERATOR

(75) Inventors: Kevin J. Gearhardt, Fort Collins, CO (US); Anita M. Ekren, Loveland, CO (US)

(73) Assignee: LSI Logic Corporation, Milpitas, CA (US)

( * ) Notice: Subject to any disclaimer, the term of this patent is extended or adjusted under 35 U.S.C. 154(b) by 161 days.

(21) Appl. No.: 11/184,621

(22) Filed: Jul. 19, 2005

(65) Prior Publication Data
US 2007/0018669 A1   Jan. 25, 2007

(51) Int. Cl.
*G01R 31/28* (2006.01)
*G06F 11/00* (2006.01)
*G06F 1/12* (2006.01)
*G06F 1/00* (2006.01)
*G01R 23/00* (2006.01)
*H03B 19/00* (2006.01)

(52) U.S. Cl. .................. 714/733; 714/707; 714/744; 714/701; 713/400; 713/500; 713/503; 327/47; 327/116

(58) Field of Classification Search .............. None
See application file for complete search history.

(56) References Cited
U.S. PATENT DOCUMENTS 6,396,323 B1 * 5/2002 Mizuno ............... 327/295

2004/0062135 A1 * 4/2004 Itakura ............... 365/232
2004/0268193 A1 * 12/2004 Nishida et al. ......... 714/724

* cited by examiner

*Primary Examiner*—Phung My Chung
(74) *Attorney, Agent, or Firm*—Luedeka, Neely & Graham, P.C.

(57) ABSTRACT

An integrated circuit, where a hard macro is resident within the integrated circuit. The hard macro receives a clock signal at a frequency that is below the operational frequency of the integrated circuit, and produces a clock signal having a frequency that is at least equal to the operational frequency of the integrated circuit. The hard macro has a first input that receives a first signal from the tester. A second input receives a second signal from the tester, offset by substantially ninety degrees from the phase of the first signal. A speed select input receives a signal, where the signal is selectively set at one of a logical high indicating a first multiplier to be applied in the hard macro, and a logical low indicating a second multiplier to be applied in the hard macro. A clock multiplication circuit receives the first signal, selectively receives the second signal, and receives the speed select signal, and produces the clock signal. The clock signal is a multiple of the tester frequency that is dependent at least in part upon the setting of the speed select signal and the tester frequency. An input receives the clock signal from the hard macro and provides the clock signal to the integrated circuit during testing.

10 Claims, 3 Drawing Sheets

TESTING WITH HIGH SPEED PULSE GENERATOR

FIELD

This invention relates to the field of integrated circuit fabrication. More particularly, this invention relates to testing of integrated circuits.

BACKGROUND

It is becoming more critical for high speed memory to be tested at actual application frequencies, or as close as the automated test equipment can facilitate. The challenge is that most automated test equipment in use, particularly the lower cost testers, cannot provide a high enough clock speed to test such memories. Such testers top out at about two hundred megahertz, which is not sufficient to properly run the needed tests. A higher speed solution is needed to perform the desired tests.

One solution is to purchase new testers that can support test frequencies well beyond the current speed limitations. However, the enormous capital expenditure that would be required for this solution is not practical for most manufacturers.

What is needed, therefore, is a system that overcomes problems such as those described above, at least in part.

SUMMARY

The above and other needs are met by an integrated circuit having an operational frequency, where a hard macro is resident on a monolithic substrate with the integrated circuit. The hard macro receives a reference clock signal from a tester that is external from the substrate at a tester frequency that is below the operational frequency of the integrated circuit, and produces a multiplied clock signal having a second frequency that is at least equal to the operational frequency of the integrated circuit. The hard macro has a first reference clock input that receives a first reference clock signal from the tester at the tester frequency and a first phase. A second reference clock input receives a second reference clock signal from the tester at the tester frequency and a second phase. The second phase is offset by substantially ninety degrees from the first phase of the first reference clock signal.

A speed select input receives a speed select signal, where the speed select signal is selectively set at one of two states, a logical high indicating a first multiplier to be applied in the hard macro, and a logical low indicating a second multiplier to be applied in the hard macro. A clock multiplication circuit receives the first reference clock signal, selectively receives the second reference clock signal, and receives the speed select signal, and produces the multiplied clock signal at a multiplied clock output. The multiplied clock signal has the second frequency, which is a multiple of the tester frequency that is dependent at least in part upon the setting of the speed select signal and the tester frequency. An input receives the multiplied clock signal from the hard macro and provides the multiplied clock signal to portions of the integrated circuit during testing of the integrated circuit.

In this manner, the logic to generate the high-speed clock is implemented on the actual device to be tested. One feature of this invention is its ability to provide a multiplied clock frequency for built in self testing, which multiplied frequency is under the control of the tester, through the provided reference signals. The more common approach of using an on-chip PLL to provide the clock multiplication cannot easily be controlled with respect to shutting down the on-chip multiplied clock, which is a critical component of post-manufacturing device analysis and failure analysis.

According to another aspect of the invention there is provided a method of testing an integrated circuit at an operational frequency of the integrated circuit. The integrated circuit is connected to a tester, and the tester is set to provide a clock frequency to the integrated circuit, where the clock frequency is less than the operational frequency of the integrated circuit. The clock frequency is received with a hard macro within the integrated circuit, and increased with the hard macro to a multiplied frequency that is substantially at least as high as the operational frequency of the integrated circuit. The multiplied frequency is provided to the integrated circuit, which is tested at the multiplied frequency.

In one embodiment, a speed select signal is provided to the hard macro, and the clock frequency is increased to the multiplied frequency, which is dependent at least in part on the speed select signal and the clock frequency. The step of receiving the clock frequency preferable includes receiving a first clock signal and a second clock signal, each having the clock frequency, where a phase of the first clock signal is offset by substantially ninety degrees from a phase of the second clock signal.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
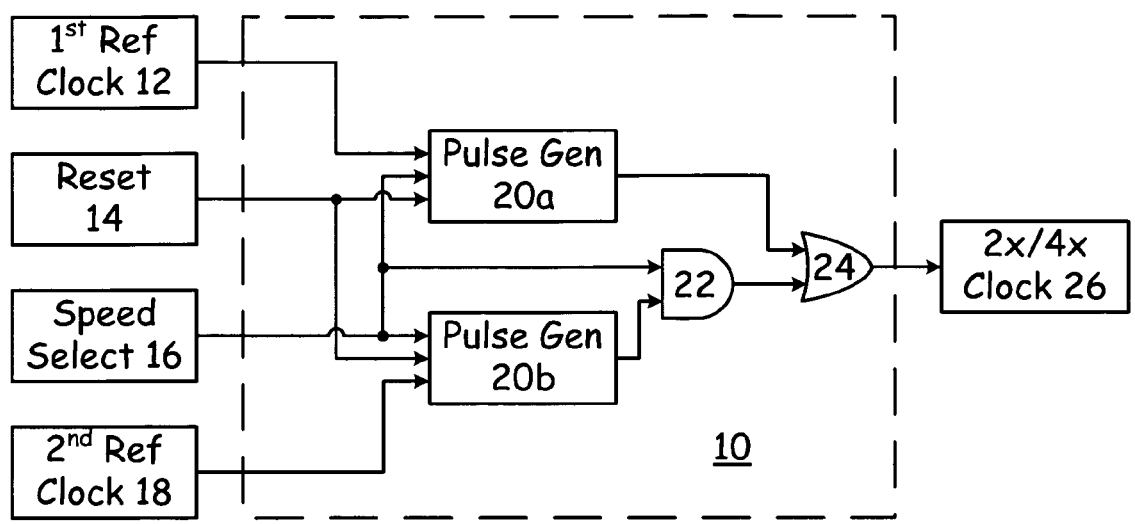
FIG. 1 is a logic diagram of a clock speed increasing circuit according to a preferred embodiment of the present invention.

With reference now to FIG. 1, there is depicted a clock speed increasing circuit 10 according to a preferred embodiment of the present invention. The circuit 10 is created as a built-in self test hard macro within the integrated circuit to be tested, such as by being created on the same monolithic substrate and at the same time as the integrated circuit. The circuit 10 receives one or more clock signals from the offboard tester, as described in more detail below, and increases the frequency of the clock signals to create a new, higher speed clock signal that is used as the testing frequency for the integrated circuit, such as a high speed memory circuit.

This allows for clock doubling on-chip relative to a single reference clock provided by the tester, or clock quadrupling on-chip relative to two reference clocks provided by the tester. The circuit 10 is intended to be implemented as a hard macro within an integrated circuit technology library in order to ensure that its performance is consistent from one device to another, independent of layout and routing differences between unique designs.

The circuit 10 preferably consists of a digital logic block consisting of four inputs, first reference clock 12, reset 14, speed select 16, and second reference clock 18, and one output doubled/quadrupled clock 26, as depicted in FIG. 1. These inputs and output are described in more detail below.

The reset signal 14 is preferably used to initialize the clock multiplier circuit 10 at the beginning of the test block to be run on the tester. A logical zero is preferably used to force the reset condition, followed by a logical one for the duration of the test block. The speed select signal 16 is preferably used to set the clock multiplier to a factor of either two or four, where a logical zero preferably denotes a multiplier of two, and a logical one preferably denotes a multiplier of four.

When a multiplication factor of two is desired, preferably the only reference clock input that is used is the first reference clock 12. This is preferably a two hundred megahertz maximum signal from the tester, or whatever else the maximum frequency is of the tester being used. The signal 12 is preferably supplied with a fifty percent duty cycle, such that both the rising and falling edges of the reference clock 12 generate an on-chip clock pulse pair, or a multiplication factor of two relative to the tester's operational frequency, as depicted in the timing diagram of FIG. 4.

When a multiplication factor of four is desired, preferably both of the reference clock inputs, the first reference clock 12 and the second reference clock 18, are used. These two reference clocks are preferably supplied such that the second clock 18 is substantially ninety degrees out of phase relative to the first reference clock 12. Both clocks 12 and 18 preferably have a fifty percent duty cycle, and the rising and falling edges of both generate an on-chip clock sequence of four pulses, or a multiplication factor of four relative to the tester's operational frequency, again as depicted in the timing diagram of FIG. 4.

Figure 2:
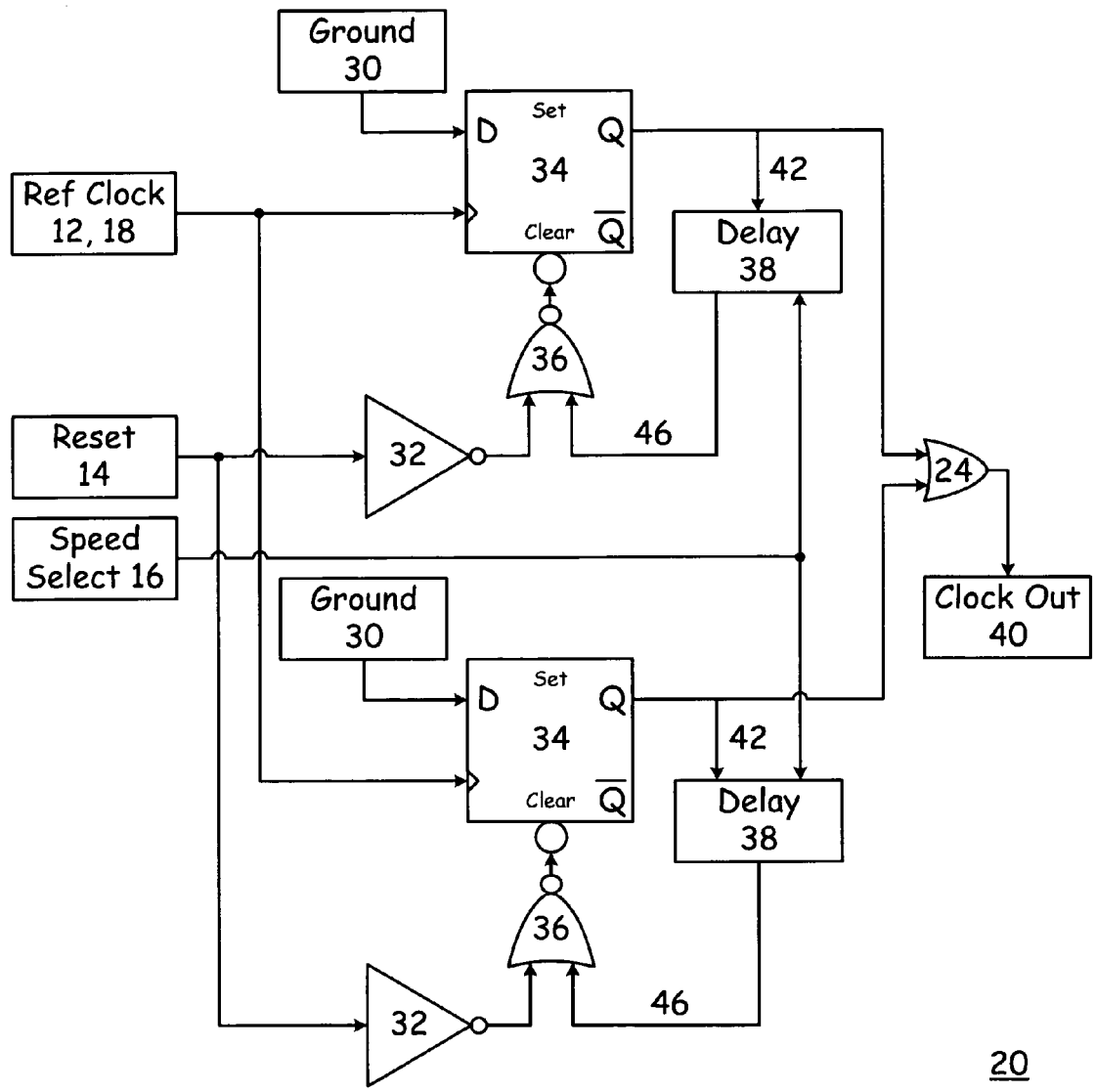
FIG. 2 is a logic diagram of a pulse generator circuit according to a preferred embodiment of the present invention.
Figure 3:
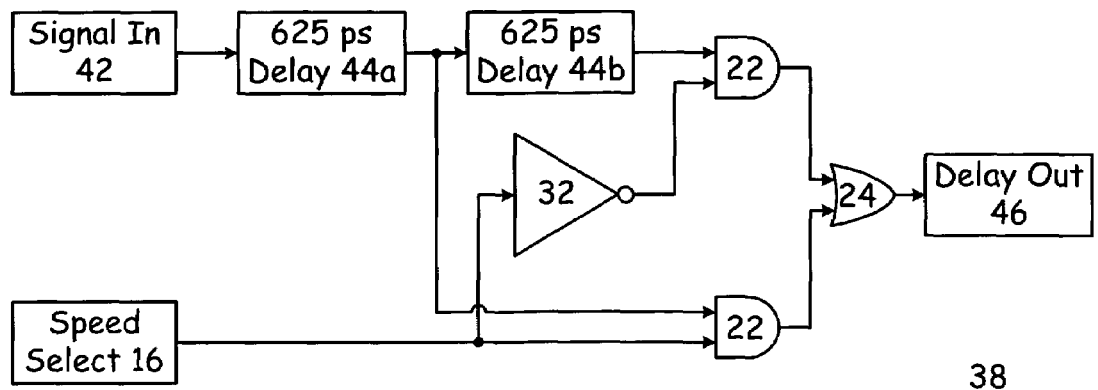
FIG. 3 is a logic diagram of a delay circuit according to a preferred embodiment of the present invention.

The pulse generators 20a and 20b depicted in FIG. 1 are circuits that preferably generate a narrow pulse referenced to both the rising and falling edge of the reference clock signals 12 and 18 provided to the circuit 10. The pulse generators 20 could be designed in a variety of different embodiments as determined by a circuit designer. FIGS. 2 and 3 represent possible implementations of the pulse generator circuit 20.

FIG. 2 depicts one embodiment of the pulse generator circuit 20 that takes a single input clock signal, such as either one of the first reference clock 12 or the second reference clock 18, and generates two clock out pulses 40 for each input clock signal. The upper flip-flop is preferably a rising-edge-triggered circuit, and the lower flip-flow is preferably a falling-edge-triggered circuit. The two flip-flop outputs are logically OR'd at gate 24 to create the clock out signal 40 with a multiplication factor of two. OR'ing two such circuits 20 together as shown in FIG. 1 creates the multiplication factor of four. It is appreciated that other circuits could accomplish this same multiplication of the input clock signal.

FIG. 3 depicts one embodiment of the delay circuits 38 depicted in FIG. 2. The speed select signal 16 preferably selects either a 625 picosecond or 1,250 picosecond delay as appropriate for a multiplication factor of either two or four, respectively. It is appreciated that other circuits could create the desired delays as described herein.

Figure 4:
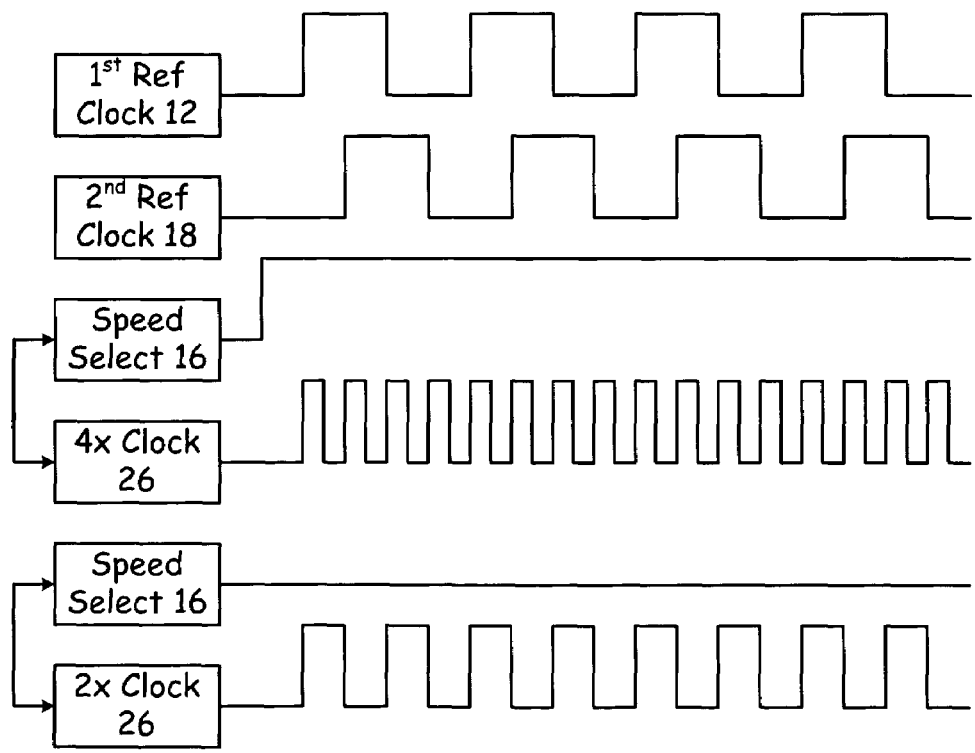
FIG. 4 is a timing diagram of the clock speed increasing circuit according to a preferred embodiment of the present invention.

FIG. 4 depicts is a timing diagram of the operation of the circuit in a mode with a multiplication factor of four. A mode of a multiplication factor of two preferably operates in the same fashion, except that the speed select signal 16 is low, disabling the second reference clock 18 and causing the delay in FIG. 3 to generate a 1,250 picosecond pulse instead of a 625 picosecond pulse.

The factor of two or factor of four clock signal 26 is preferably routed off-chip in one test mode, such that the operation of the circuit 10 can be calibrated relative to the tester before testing the integrated circuit to be tested. The high-speed clock 26 generated on the chip can thus be optimized relative to the reference clock or clocks from the tester. The tester-provided signals 12 and 18 will typically not have a perfect fifty percent duty cycle as programmed from within the test program for the device under test. Thus, a calibration routine allows the rising and falling edges of the reference clocks 12 and 18 from the tester to be set to optimize the frequency of the on-chip multiplied clock 26 with respect to any jitter created by a non-fifty percent duty cycle reference.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A hard macro resident on a monolithic substrate with an integrated circuit having an operational frequency, the hard macro adapted to receive a reference clock signal from a tester that is external to the substrate at a tester frequency that is below the operational frequency of the integrated circuit and produce a multiplied clock signal having a second frequency that is at least equal to the operational frequency of the integrated circuit, the hard macro comprising:

a first reference clock input adapted to receive a first reference clock signal from the tester at the tester frequency and a first phase, a second reference clock input adapted to receive a second reference clock signal from the tester at the tester frequency and a second phase, where the second phase is offset by substantially ninety degrees from the first phase of the first reference clock signal, a speed select input adapted to receive a speed select signal, where the speed select signal is selectively set at one of at least a logical high indicating a first multiplier to be applied in the hard macro, and a logical low indicating a second multiplier to be applied in the hard macro, and a clock multiplication circuit adapted to receive the first reference clock signal, selectively receive the second reference clock signal, and receive the speed select signal and produce the multiplied clock signal at a multiplied clock output, where the multiplied clock signal has the second frequency, which is a multiple of the tester frequency that is dependent at least in part upon the tester frequency and the setting of the speed select signal.

2. The integrated circuit of claim 1, further comprising an output for providing the multiplied clock signal to the tester to provide a calibration signal for the first reference clock signal and the second reference clock signal.

3. The integrated circuit of claim 1, wherein the first multiplier is two and the second multiplier is four.

4. An integrated circuit having an operational frequency, comprising:
   a hard macro resident on a monolithic substrate with the integrated circuit, the hard macro adapted to receive a reference clock signal from a tester that is external from the substrate at a tester frequency that is below the operational frequency of the integrated circuit and produce a multiplied clock signal having a second frequency that is at least equal to the operational frequency of the integrated circuit, the hard macro comprising,
      a first reference clock input adapted to receive a first reference clock signal from the tester at the tester frequency and a first phase,
      a second reference clock input adapted to receive a second reference clock signal from the tester at the tester frequency and a second phase, where the second phase is offset by substantially ninety degrees from the first phase of the first reference clock signal,
      a speed select input adapted to receive a speed select signal, where the speed select signal is selectively set at one of at least a logical high indicating a first multiplier to be applied in the hard macro, and a logical low indicating a second multiplier to be applied in the hard macro, and
      a clock multiplication circuit adapted to receive the first reference clock signal, selectively receive the second reference clock signal, and receive the speed select signal and produce the multiplied clock signal at a multiplied clock output, where the multiplied clock signal has the second frequency, which is a multiple of the tester frequency that is dependent at least in part upon the tester frequency and the setting of the speed select signal, and
      an input adapted to receive the multiplied clock signal from the hard macro and provide the multiplied clock signal to portions of the integrated circuit during testing of the integrated circuit.

5. The integrated circuit of claim 4, further comprising an output for providing the multiplied clock signal to the tester to provide a calibration signal for the first reference clock signal and the second reference clock signal.

6. The integrated circuit of claim 4, wherein the first multiplier is two and the second multiplier is four.

7. A method of testing an integrated circuit at an operational frequency of the integrated circuit, the method comprising the steps of:
   connect the integrated circuit to a tester,
   set the tester to provide a clock frequency to the integrated circuit, where the clock frequency is less than the operational frequency of the integrated circuit,
   receive the clock frequency with a hard macro within the integrated circuit,
   increase the clock frequency with the hard macro to a multiplied frequency that is substantially at least as high as the operational frequency of the integrated circuit,
   provide the multiplied frequency to the integrated circuit, and
   test the integrated circuit at the multiplied frequency.

8. The method of claim 7, further comprising the steps of:
   provide a speed select signal to the hard macro, and
   increase the clock frequency to the multiplied frequency, where the multiplied frequency is dependent at least in part on the speed select signal and the clock frequency.

9. The method of claim 7, wherein the step of receiving the clock frequency further comprises receiving a first clock signal and a second clock signal each having the clock frequency, where a phase of the first clock signal is offset by substantially ninety degrees from a phase of the second clock signal.

10. The method of claim 7, wherein the multiplied frequency is one of a factor of two times the clock frequency and a factor of four times the clock frequency.

* * * * *